United States Patent
Zolomy et al.

(10) Patent No.: US 11,750,167 B2
(45) Date of Patent: Sep. 5, 2023

(54) APPARATUS FOR RADIO-FREQUENCY MATCHING NETWORKS AND ASSOCIATED METHODS

(71) Applicant: Silicon Laboratories Inc., Austin, TX (US)

(72) Inventors: Attila Zolomy, Budapest (HU); Christopher L. McCrank, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 15/823,319

(22) Filed: Nov. 27, 2017

(65) Prior Publication Data

US 2019/0165754 A1    May 30, 2019

(51) Int. Cl.
| | |
|---|---|
| *H03H 7/40* | (2006.01) |
| *H04B 1/18* | (2006.01) |
| *H03H 7/38* | (2006.01) |
| *H04B 1/00* | (2006.01) |
| *H03F 3/19* | (2006.01) |
| *H03F 3/24* | (2006.01) |
| *H03F 1/56* | (2006.01) |
| *H03F 3/45* | (2006.01) |

(52) U.S. Cl.
CPC ............ *H03H 7/40* (2013.01); *H03F 1/565* (2013.01); *H03F 3/19* (2013.01); *H03F 3/245* (2013.01); *H03F 3/45475* (2013.01); *H03H 7/38* (2013.01); *H04B 1/18* (2013.01); *H03F 2200/294* (2013.01); *H03F 2200/451* (2013.01); *H03F 2203/45731* (2013.01); *H03H 2007/386* (2013.01); *H04B 1/0092* (2013.01)

(58) Field of Classification Search
CPC ........................................................ H03H 7/40
See application file for complete search history.

(56) References Cited

U.S. PATENT DOCUMENTS

| | | | |
|---|---|---|---|
| 4,328,501 | A | 5/1982 | DeSantis |
| 4,799,066 | A | 1/1989 | Deacon |
| 5,631,611 | A | 5/1997 | Luu |

(Continued)

FOREIGN PATENT DOCUMENTS

| | | |
|---|---|---|
| CN | 106505962 A | 3/2017 |
| EP | 2214306 | 8/2010 |
| KR | 20150072119 A | 6/2015 |

OTHER PUBLICATIONS

Wideband Code Division Multiple Access, Feb. 2014, www.3gpp.org/technologies/keywords-acronyms/104-w-cdma (Year: 2014).*

(Continued)

*Primary Examiner* — Samuel S Outten
(74) *Attorney, Agent, or Firm* — Law Offices of Maximilian R. Peterson

(57) ABSTRACT

A radio-frequency (RF) apparatus includes a wideband receive (RX) impedance matching circuit to provide a received differential RF signal to RF receive circuitry. The wideband RX impedance matching circuit includes first and second inductors to receive the differential RF signal. The wideband RX impedance matching circuit further includes a third inductor coupled across an input o the RF receive circuitry. The third inductor performs the functionality of a capacitor having a negative capacitance value.

20 Claims, 14 Drawing Sheets

(56) References Cited

U.S. PATENT DOCUMENTS

| | | |
|---|---|---|
| 5,874,926 A | 2/1999 | Tsuru |
| 5,889,445 A | 3/1999 | Ritter |
| 5,949,299 A | 9/1999 | Harada |
| 5,995,814 A | 11/1999 | Yeh |
| 6,009,318 A | 12/1999 | Freed |
| 6,329,886 B1 | 12/2001 | Ogoro |
| 6,603,430 B1 | 8/2003 | Hill |
| 6,862,441 B2 | 3/2005 | Ella |
| 6,980,776 B2 | 12/2005 | Shimada |
| 6,990,357 B2 | 1/2006 | Ella |
| 7,034,630 B2 | 4/2006 | Rijks |
| 7,058,372 B1 | 6/2006 | Pardoen |
| 7,088,307 B2 | 8/2006 | Imaizumi |
| 7,116,185 B2 | 10/2006 | Ohi |
| 7,155,252 B2 | 12/2006 | Martin |
| 7,193,477 B2 | 3/2007 | Chang et al. |
| 7,199,684 B2 | 4/2007 | Aigner |
| 7,248,844 B2 | 7/2007 | Rofougaran |
| 7,323,939 B2 | 1/2008 | Han et al. |
| 7,330,085 B2 | 2/2008 | Ezzeddine |
| 7,466,277 B2 | 12/2008 | Ishizuka |
| 7,489,914 B2 | 2/2009 | Govind |
| 7,518,469 B2 | 4/2009 | Kemmochi |
| 7,557,757 B2 | 7/2009 | Deavours |
| 7,586,388 B2 | 9/2009 | Harada |
| 7,683,733 B2 | 3/2010 | Li |
| 7,755,435 B2 | 7/2010 | Lu et al. |
| 7,978,024 B2 | 7/2011 | Cheng |
| 8,068,795 B2 | 11/2011 | Bavisi |
| 8,081,047 B2 | 12/2011 | Royak |
| 8,138,853 B2 | 3/2012 | Chu |
| 8,164,387 B1 | 4/2012 | Apel |
| 8,174,390 B2 | 5/2012 | Kim |
| 8,229,367 B2 | 7/2012 | Chan et al. |
| 8,306,489 B2 | 11/2012 | Schwarzmueller |
| 8,344,952 B2 | 1/2013 | Yi |
| 8,368,481 B2 | 2/2013 | Jin |
| 8,436,695 B2 | 5/2013 | Mu |
| 8,493,126 B2 | 7/2013 | Sankaranarayanan |
| 8,633,781 B2 | 1/2014 | Bradley |
| 8,842,410 B2 | 9/2014 | Chan |
| 9,059,681 B2 | 6/2015 | Tanaka |
| 9,083,301 B2 | 7/2015 | Tanaka |
| 9,106,204 B2 | 8/2015 | Fritz |
| 9,306,535 B2 | 4/2016 | Bradley |
| 9,316,723 B2 | 4/2016 | Tayrani |
| 9,397,720 B2 | 7/2016 | Jerng |
| 9,520,854 B2 | 12/2016 | Kim |
| 9,647,706 B2 | 5/2017 | Salfelner |
| 9,680,442 B2 | 6/2017 | Salfelner |
| 9,917,566 B2 | 3/2018 | Salfelner |
| 9,939,471 B1 | 4/2018 | Omoumi |
| 9,991,597 B2 | 6/2018 | Velandia |
| 10,071,605 B1 | 9/2018 | Liang |
| 10,305,532 B1 | 5/2019 | Jantzi |
| 10,374,300 B2 | 8/2019 | Rahikkala |
| 2002/0118075 A1 | 8/2002 | Ohwada |
| 2003/0012808 A1 | 7/2003 | Ella |
| 2003/0174093 A1 | 9/2003 | Huber |
| 2003/0210189 A1 | 11/2003 | Jinushi |
| 2005/0003771 A1 | 1/2005 | De Ruijter |
| 2005/0174297 A1 | 8/2005 | Cake |
| 2005/0208917 A1 | 9/2005 | Roufoogaran |
| 2006/0044080 A1 | 3/2006 | Hagiwara |
| 2006/0092079 A1 | 5/2006 | de Rochemont |
| 2006/0103578 A1 | 5/2006 | Landaeus |
| 2007/0001704 A1 | 1/2007 | O'Mahony |
| 2007/0024377 A1 | 2/2007 | Wang et al. |
| 2007/0268092 A1 | 11/2007 | Inoue |
| 2008/0129610 A1 | 6/2008 | Tsafati et al. |
| 2008/0174383 A1 | 7/2008 | Zolomy et al. |
| 2008/0186106 A1 | 8/2008 | Christian |
| 2008/0278258 A1 | 11/2008 | Liu |
| 2009/0015500 A1 | 1/2009 | Hoshiai |
| 2009/0085689 A1 | 4/2009 | Rohani |
| 2009/0121959 A1 | 5/2009 | Li |
| 2009/0130999 A1* | 5/2009 | Chen ................. H04B 1/18 455/129 |
| 2009/0174618 A1 | 7/2009 | Huang |
| 2009/0251382 A1 | 10/2009 | Umehara |
| 2009/0315792 A1 | 12/2009 | Miyashita |
| 2009/0322617 A1 | 12/2009 | Tseng |
| 2010/0073248 A1 | 3/2010 | Motta |
| 2010/0109846 A1 | 5/2010 | Nagai |
| 2010/0231451 A1 | 9/2010 | Noguchi |
| 2010/0238079 A1 | 9/2010 | Ayatollahi |
| 2010/0253581 A1 | 10/2010 | Tsou |
| 2010/0265145 A1 | 10/2010 | Chung |
| 2010/0289700 A1 | 11/2010 | Yang |
| 2011/0223873 A1 | 9/2011 | Qiu |
| 2011/0256841 A1 | 10/2011 | Kakuya |
| 2012/0001821 A1 | 1/2012 | Nakano |
| 2012/0112972 A1 | 5/2012 | Ogawa |
| 2012/0154071 A1 | 6/2012 | Bradley |
| 2012/0229360 A1 | 9/2012 | Jagielski |
| 2012/0314734 A1 | 12/2012 | Zierdt |
| 2013/0033410 A1 | 2/2013 | Wong |
| 2013/0214812 A1 | 8/2013 | Koo |
| 2013/0307742 A1 | 11/2013 | Hu |
| 2013/0314288 A1 | 11/2013 | Tayrani |
| 2013/0334215 A1 | 12/2013 | Chen |
| 2013/0341411 A1 | 12/2013 | Kai |
| 2014/0111381 A1 | 4/2014 | Lee |
| 2014/0111382 A1 | 4/2014 | Lee |
| 2014/0113679 A1 | 4/2014 | Wehrmann |
| 2014/0125540 A1 | 5/2014 | Tetsuno |
| 2014/0125548 A1 | 5/2014 | Jouanlanne |
| 2014/0125552 A1 | 5/2014 | Takisawa |
| 2014/0320351 A1 | 10/2014 | Wei |
| 2014/0327494 A1* | 11/2014 | Sato ................. H03H 11/348 333/103 |
| 2014/0375507 A1 | 12/2014 | Lin |
| 2014/0375527 A1 | 12/2014 | Rutfors |
| 2015/0022402 A1 | 1/2015 | Gavilan |
| 2015/0048896 A1 | 2/2015 | Kovac |
| 2015/0311881 A1 | 10/2015 | Nagumo |
| 2015/0349726 A1 | 12/2015 | Han et al. |
| 2016/0156335 A1* | 6/2016 | Takeuchi ............. H03H 7/38 333/32 |
| 2016/0164474 A1 | 6/2016 | Beltran |
| 2016/0268992 A1 | 9/2016 | Salfelner |
| 2016/0336649 A1 | 11/2016 | Yu |
| 2017/0214378 A1 | 7/2017 | Black |
| 2017/0244442 A1 | 8/2017 | Mizokami |
| 2018/0062254 A1 | 3/2018 | Rahikkala |
| 2018/0145410 A1 | 5/2018 | Ban |
| 2018/0316082 A1 | 11/2018 | Keller |
| 2019/0190149 A1 | 6/2019 | Vida |

OTHER PUBLICATIONS

Reactance, Oct. 2015, http://www.britannica.com/technology/reactance (Year: 2015).*

U.S. Appl. No. 15/250,719, filed Aug. 2016, Rahikkala.
U.S. Appl. No. 16/439,458, filed Jun. 2019, Rahikkala.
U.S. Appl. No. 15/845,327, filed Dec. 2017, Vida.
U.S. Appl. No. 15/845,369, filed Dec. 2017, Vida.
U.S. Appl. No. 16/237,511, filed Dec. 2018, Zólomy.
U.S. Appl. No. 16/237,583, filed Dec. 2018, Zólomy.
U.S. Appl. No. 16/420,111, filed May 2019, Voor.
U.S. Appl. No. 16/420,116, filed Feb. 2019, Zólomy.
U.S. Appl. No. 16/719,925, filed Dec. 2019, Vida.
U.S. Appl. No. 16/724,160, filed Dec. 2019, Zólomy.
U.S. Appl. No. 17/491,195, filed Sep. 2021, Hänninen.
U.S. Appl. No. 17/491,221, filed Sep. 2021, Rahikkala.
Johanson Technology, *High Frequency Ceramic Solutions*, 4 pgs., 2016.
Johanson Technology, *High Frequency Ceramic Solutions*, 4 pgs., 2014.
AN91445, *Antenna Design and RF Layout Guidelines*, Cypress, 60 pgs., 2014-2016.

(56) References Cited

OTHER PUBLICATIONS

Amotech Co., Ltd., *Datasheet*, 8 pgs., 2009.
Office communication in U.S. Appl. No. 15/250,719, 9 pgs.
Office communication in U.S. Appl. No. 15/250,719, 8 pgs.
AN923: EFR32 sub-GHz Matching Guide, Silicon Labs, Jun. 29, 2016, 25 pgs.
D.C. Youla, A New Theory of Broad-band Matching, IEE Transactions on Circuit Theory, Mar. 1964, 21 pgs.
Karoly Géher: Linear Networks, 4th edition 1979, Hungarian Technical Book Press (pp. 434-436; translated portions included).
AN643: Si446x/Si4362 RX LNA Matching, Silicon Labs, 2014, 26 pgs.
Office communication in U.S. Appl. No. 15/845,327, 12 pgs.
Office communication in U.S. Appl. No. 15/845,327, 18 pgs.
Office communication in U.S. Appl. No. 15/845,327, 15 pgs.
Office communication in U.S. Appl. No. 15/845,327, 14 pgs.
Web page, "3.1 Multi-band Sub-1GHz tunable RF sub-system for smart meters" (Apr. 27, 2017, 2 pgs.), available at https://training.ti.com/multi-band-sub-1ghz-tunable-rf-sub-system-smart-meters.
Office communication in U.S. Appl. No. 16/237,511, 10 pgs.
Office communication in U.S. Appl. No. 16/237,511, 14 pgs.
Office communication in U.S. Appl. No. 16/237,583, 10 pgs.
Office communication in U.S. Appl. No. 16/237,583, 8 pgs.
Office communication in U.S. Appl. No. 16/237,583, 9 pgs.
Office communication in U.S. Appl. No. 16/420,111, 9 pgs.
Office communication in U.S. Appl. No. 16/420,111, 10 pgs.
Office communication in U.S. Appl. No. 16/420,116, 9 pgs.
Office communication in U.S. Appl. No. 16/420,116, 7 pgs.
Office communication in U.S. Appl. No. 16/719,925, 13 pgs.
Office communication in U.S. Appl. No. 16/719,925, 19 pgs.
Office communication in U.S. Appl. No. 16/719,925, 17 pgs.
Office communication in U.S. Appl. No. 16/724,160, 8 pgs.
AN427: EZ Radio PRO™ Si433X & Si443X RX LNA Matching, Silicon Labs, 2009, 22 pgs.
Liu et al., Excitation Techniques of Loop Current Mode of Ground Antenna, 2011 Cross Strait Quad Regional Radio Science and Wireless Technology Conference, 2011, 4 pgs.
Zahid et al., Analysis of a loop type ground radiation antenna based on equivalent circuit model, IET Microwave, Antennas & Propagation Journal, 2016, 6 pgs.
Cho et al., Loop-type ground antenna using capacitor, Electronics Letters, 6th Jan. 2011, vol. 47, No. 1, 1 pg.
Zhang et al., Bandwidth enhancement of ground antenna using resonant feeding circuit, Electronics Letters, Mar. 28, 2013, vol. 49, No. 7, 2 pgs.
Qu et al., Circular Polarized Ground Radiation Antenna for Mobile Applications, IEEE Transactions on Antennas and Propagation, vol. 66, No. 5, May 2018, pp. 2655-2660.
Zahid et al., Decoupler Deign for MIMO Antennas of USB Dongle Applications Using Ground Mode Coupling Analysis, Progress in Electromagnetics Research M, vol. 76, 113-122, 2018, 10 pgs.
Liu et al., Loop-Type Ground Radiation Antenna for Dual-Band WLAN Applications, IEEE Transactions on Antennas and Propagation, vol. 61, No. 9, Sep. 2013, pp. 4819-4823.
Qu et al., Compact dual-band antenna using inverted-L loop and inner rectangular loop for WLAN applications, Electronics Letters, Nov. 5, 2015, vol. 51, No. 23, pp. 1843-1844.
Liu et al., Excitation Techniques of Loop Current Mode of Ground Antenna, 2011 Cross Strait Quad-Regional Radio Science and Wireless Technology Conference, 2011, pp. 1732-1735.
Qu et al., Performance enhancement of ground radiation antenna for Z-wave applications using tunable metal loads, Electronics Letters, Oct. 27, 2016, vol. 52, No. 22, pp. 1827-1828.
Shin et al., Ground unknown, but before Radiation Antenna using Magnetic Coupling Structure, IEEE (date filing of the instant application), 3 pgs.
Qu et al., Ground Radiation Antenna for Mobile Devices, IEEE, 2017, 3 pgs.
Xu et al., Improvement of ground radiation antenna performance using compact EBG in presence of battery effects, Electronics Letters, Jun. 28, 2018, vol. 54, No. 13, pp. 789-800.
Qu et al., Decoupling between ground radiation antennas with ground-coupled loop-type isolator for WLAN applications, IET Microwaves, Antennas & Propagation, 2018, pp. 546-552.
Liu et al., Loop-type ground antenna using resonated loop feeding, intended for mobile devices, Electronics Letters, Mar. 31, 2011, vol. 47, No. 7, 2 pgs.
Piao et al., MIMO Ground-Radiation Antennas Using a Novel Closed-Decoupling-Loop for 5G Applications, IEEE 2020, pp. 142714-142724.
Kim et al., Miniaturized dual-band loop-type ground radiation antenna with enhanced bandwidth for mobile devices, Microw Opt Technol Lett., 2019, pp. 239-243.
Zahid et al., Performance evaluation of loop-type ground radiation antenna based on its optimum impedance level, Electronics Letters, Mar. 30, 2017, vol. 53, No. 7, pp. 446-448.
Hassan et al., a wideband loop-type ground radiation antenna using ground mode tuning and optimum impedance level, Microw Opt Technol Lett., 2019, pp. 1-6.
Johanson Technology, High Frequency Ceramic Solutions, 5 pgs., Oct. 12, 2020.
Office communication in U.S. Appl. No. 15/845,369, 17 pgs.
Office communication in U.S. Appl. No. 15/845,369, 15 pgs.
Office communication in U.S. Appl. No. 15/845,369, 12 pgs.
Office communication in U.S. Appl. No. 16/237,511, 15 pgs.
Office communication in U.S. Appl. No. 16/719,925, 15 pgs.
Office communication in U.S. Appl. No. 16/724,160, 28 pgs.
Search report in CN application 201911132444X, 2 pgs.
Office communication in U.S. Appl. No. 15/845,327, 3 pgs.
Office communication in U.S. Appl. No. 16/237,511, 22 pgs.
Office communication in U.S. Appl. No. 16/719,925, 18 pgs.
Office communication in U.S. Appl. No. 16/719,925, 22 pgs.
Office communication in U.S. Appl. No. 15/845,327, 6 pgs.
Office communication in U.S. Appl. No. 15/845,369, 10 pgs.
Office communication in U.S. Appl. No. 16/237,511, 31 pgs.
Office communication in U.S. Appl. No. 17/705,260, 7 pgs.

\* cited by examiner

APPARATUS FOR RADIO-FREQUENCY MATCHING NETWORKS AND ASSOCIATED METHODS

TECHNICAL FIELD

The disclosure relates generally to radio-frequency (RF) apparatus and, more particularly, to apparatus for impedance matching networks or circuits in RF apparatus, and associated methods.

BACKGROUND

With the increasing proliferation of wireless technology, such as Wi-Fi, Bluetooth, and mobile or wireless Internet of things (IoT) devices, more devices or systems incorporate RF circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry.

The RF ICs typically work with circuitry external to the IC to provide a wireless solution. Examples of the external circuitry include baluns, matching circuitry, antennas, filters, switches, and the like.

SUMMARY

A variety of apparatus and associated methods are contemplated according to exemplary embodiments. According to one exemplary embodiment, an RF apparatus includes a wideband receive (RX) impedance matching circuit to provide a received differential RF signal to RF receive circuitry. The wideband RX impedance matching circuit includes first and second inductors to receive the differential RF signal. The wideband RX impedance matching circuit further includes a third inductor coupled across an input o the RF receive circuitry. The third inductor performs the functionality of a capacitor having a negative capacitance value.

According to another exemplary embodiment, a method of operating an RF apparatus that includes RF receive circuitry is disclosed. The method includes using a wideband RX impedance matching circuit to match an impedance of a circuit that provides a received RF signal to an impedance of the RF receive circuitry, by using an inductor coupled across an input of the RF receive circuitry, where the inductor performing the functionality of a capacitor having a negative capacitance value.

According to another exemplary embodiment, a method of designing an impedance matching circuit includes designing a single-ended RX impedance matching circuit comprising at least one capacitor having a negative capacitance value. The method further includes replacing the at least one capacitor with an inductor.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
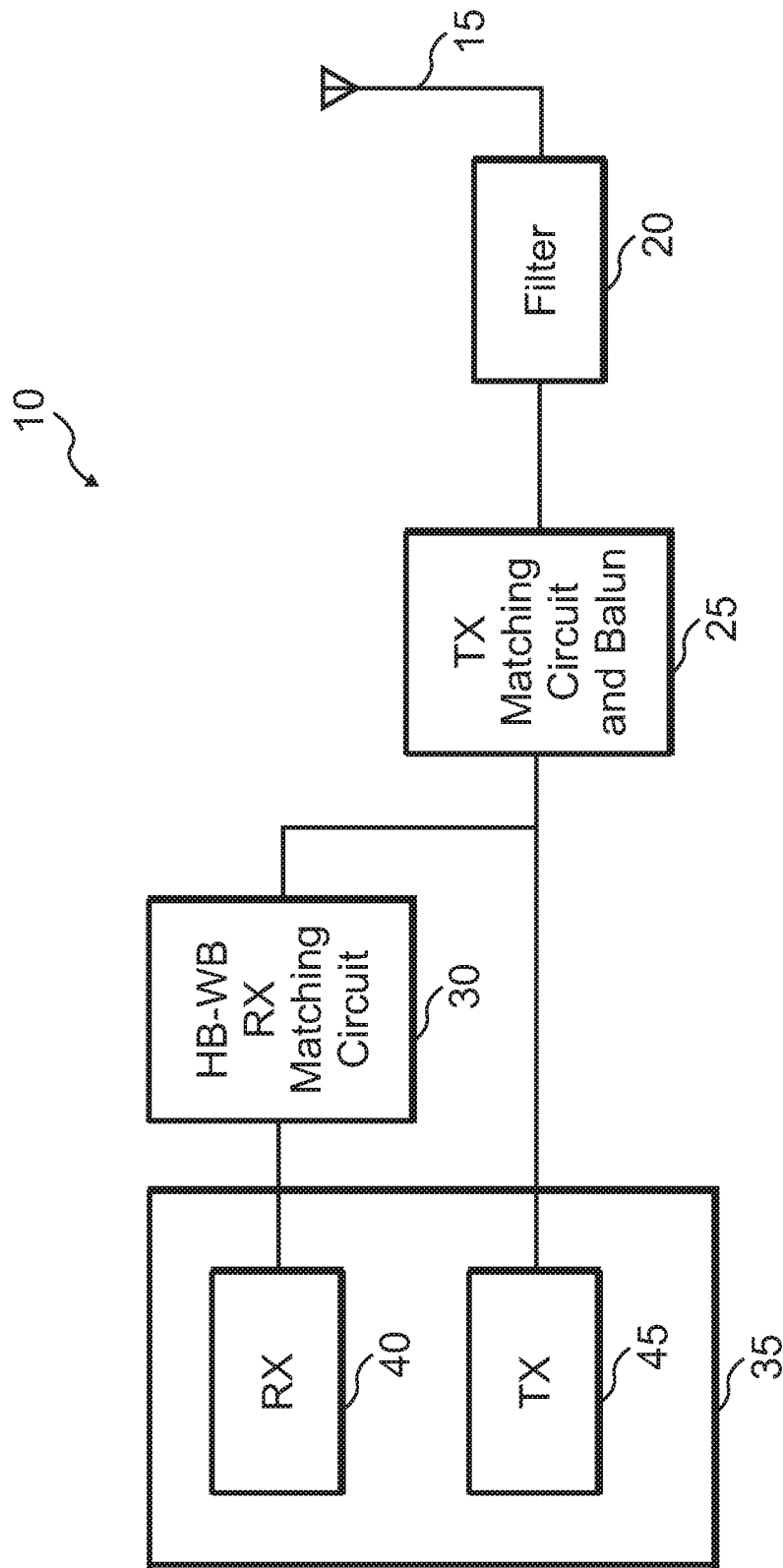
FIG. 1 shows a circuit arrangement for an RF apparatus with wideband impedance matching circuitry working in higher frequency bands (denoted by "HB-WB") according to an exemplary embodiment.

The disclosure relates generally to RF apparatus and, more particularly, to apparatus for impedance matching circuits (or impedance matching networks or impedance matching circuitry or matching circuit or matching networks or matching circuitry) in RF apparatus, and associated methods. As persons of ordinary skill in the art will understand, impedance matching circuits may be called simply "matching circuits."

Impedance matching or impedance transformation circuits are typically used in RF apparatus, such as receivers, transmitters, and/or transceivers, to provide an interface or match between circuitry that have different impedances.

More specifically, in the case of purely resistive impedances, maximum power transfer takes place when the output impedance of a source circuit equals the input impedance of a load circuit. In the case of complex impedances, maximum power transfer takes place when the input impedance of the load circuit is the complex conjugate of the output impedance of the source circuit.

As an example, consider an antenna with a 50-ohm impedance ($R=50\Omega$) coupled to a receive or receiver (RX) circuit with a 50-ohm impedance. In this case, maximum power transfer takes place without the user of an impedance matching circuit because the output impedance of the antenna equals the input impedance of the RX circuit.

Now consider the situation where an antenna with a 50-ohm impedance (R=50Ω) coupled to an RX circuit with a 250-ohm impedance. In this case, because the respective impedances of the antenna and the RX circuit are not equal, maximum power transfer does not take place.

Use of an impedance matching circuit, however, can match the impedance of the antenna to the impedance of the RX circuit. As a result of using the impedance matching circuit, maximum power transfer from the antenna to the RX circuit takes place.

More specifically, the impedance matching circuit is coupled between the antenna and the RX circuit. The impedance matching circuit has two ports, with one port coupled to the antenna, and another port coupled to the RX circuit, respectively.

At the port coupled to the antenna, the impedance matching circuit ideally presents a 50-ohm impedance to the antenna. As a result, maximum power transfer takes place between the antenna and the impedance matching circuit.

Conversely, at the port coupled to the RX circuit, the impedance matching circuit presents a 250-ohm impedance to the RX circuit. Consequently, maximum power transfer takes place between the impedance matching circuit and the RX circuit.

In practice, the impedance matching circuit often fails to perfectly match the impedances. In other words, signal transmission from one network to another is not perfect and 100% of the signal power is not transmitted. As a result, reflection occurs at the interface between circuits or networks with imperfectly matched impedances.

The reflection coefficient, S11, may serve as one measure or figure of merit for the level of impedance matching. A lower S11 denotes better power transmission (better impedance matching), and vice-versa.

In exemplary embodiments, impedance matching circuits or apparatus including impedance matching circuits, and associated methods are disclosed. The impedance matching circuits are relatively low cost, may be used with both RF receivers and RF transceivers, and provide a way of tying together the receiver (RX) and transmit (RX) path circuits without using TX/RX switches.

Furthermore, impedance matching circuits according to various embodiments may be adapted to various operating frequency ranges, power levels, and RX circuit or RX and TX circuit impedances. In addition, impedance matching circuits according to various embodiments may be used with a variety of RX or RX and TX circuit configurations (e.g., single-ended versus differential)

One aspect of the disclosure relates to wideband impedance matching circuits. In conventional impedance matching circuits, such as matching circuits used in sub-gigahertz frequencies, are single band solutions. As a result, for each frequency band, such as each ultra high frequency (UHF) band, a separate matching circuit is used.

Impedance matching circuits according to the disclosure, however, provide wideband (WB) operation, e.g., in the 315 MHz, 390 MHz, and 434 MHz frequency bands. Wideband operation may for instance encompass a relative bandwidth variation range of about 0.5% to 3%. For example, typical allowed bandwidth of the non-licensed ultra-high frequency (UHF) short range ISM bands is 1 MHz to 30 MHz, i.e., the relative bandwidth of these bands varies between 0.5% to 3%. As another example, a WB impedance matching circuit that can cover multiple UHF ISM bands has 100 MHz to 200 MHz bandwidth or higher, i.e., a relative bandwidth of 10% to 20%, or higher, as desired. As such, impedance matching circuits according to various embodiments accommodate RF communication that specify multi-band operations, such as standard promulgated by the European Telecommunications Standards Institute (ETSI) that call for operation in both the 868 MHz and 915 MHz bands.

Another aspect of the disclosure relates to wideband impedance matching circuits that provide impedance matching in a relatively high frequency band, i.e., HB-WB impedance matching circuits. In exemplary embodiments, the high band may constitute the 868 MHz band to, for example, accommodate integrated passive device (IPD) realizations. The IPD may include the wideband RX impedance matching circuit 30, the TX impedance matching circuit and balun 25, and/or filter 20.

As persons of ordinary skill in the art will understand, however, the disclosed concepts may be used to provide impedance matching circuits for other frequency bands. Other frequency bands may be accommodated by making appropriate modifications to the component values used in the impedance matching circuits, as persons of ordinary skill in the art will understand.

Another aspect of the disclosure relates to wideband impedance matching circuits that provide impedance matching in a relatively low frequency band, i.e., LB-WB impedance matching circuits. In exemplary embodiments, the high band may constitute the 434 MHz band to, for example, accommodate IPD realizations.

As persons of ordinary skill in the art will understand, however, the disclosed concepts may be used to provide impedance matching circuits for other frequency bands. Other frequency bands may be accommodated by making appropriate modifications to the component values used in the impedance matching circuits, as persons of ordinary skill in the art will understand. Generally speaking, the LB matching circuits provide impedance matching in a lower frequency band than do the HB matching circuits (hence the "HB-WB" and "LB-WB" designations in the figures).

Some exemplary embodiments are described with component values and/or impedance values and/or configurations (single-ended versus differential) for particular HBs and LBs, such as 868 MHz and 434 MHz, respectively, or for particular RX and/or TX circuitry. Such embodiments are merely illustrative and are not intended and should not be construed as limiting the disclosed concepts.

As persons of ordinary skill in the art will understand, the concepts for wideband impedance matching circuits are not limited to those exemplary or illustrative HB and LB values or impedance levels (e.g., input impedance of RX circuitry). Impedance matching circuits that accommodate other frequency bands and/or impedance values may be designed and realized by making appropriate modifications or designing appropriate impedance matching circuits, as persons of ordinary skill in the art will understand.

FIG. 1 shows a circuit arrangement 10 for an RF apparatus with HB-WB impedance matching circuitry according to an exemplary embodiment. The embodiment in FIG. 1 shows an RF apparatus 35 that has both RX and TX functionality, i.e., an RF transceiver. As noted above, the component and impedance values used below are merely exemplary and not limiting.

Antenna 15 receives or transmits RF signals, depending on the mode of operation of the RF apparatus, i.e., RX and TX, respectively. Antenna 15 is coupled to filter 20. Filter 20 is coupled to TX matching circuit balun 25, which is coupled to transmit (TX) circuitry 45. Note that filter 20 is optional in various embodiments, and may be omitted. More specifically, filter 20 is typically used if the TX mode of operation generates higher harmonics than allowed by the applicable or desired standards, or if in the RX mode of operation higher selectivity or blocking is desired.

TX matching circuit balun 25 is also coupled to HB-WB RX impedance matching circuit 30. HB-WB RX impedance matching circuit 30 is coupled to receiver or receive (RX) circuitry 40. Details of HB-WB RX impedance matching circuit 30 and its designs are described below in detail.

In the RX mode, the single ended signal from the 50-ohm antenna 15 is filtered by filter 20 and provided to TX matching circuit and balun 25. TX matching circuit and balun 25 transforms the antenna's single-ended impedance to the impedance of TX circuitry 45 (typically a differential impedance, i.e., the output impedance of the power amplifier in TX circuitry 45). In this configuration, the TX matching circuit and balun 25 should be resonating with the internal parasitics of TX circuitry 45, e.g., the series parasitic inductances and with the internal tunable power amplifier capacitor.

HB-WB RX impedance matching circuit 30 is also coupled to the 125-ohm differential side of TX matching circuit and balun 25. HB-WB RX impedance matching circuit 30 up-converts the impedance to the impedance at the input of RX circuitry 40, typically the input of a low noise amplifier (LNA). HB-WB RX impedance matching circuit 30 resonates with the series parasitic inductances (e.g., bond-wire parasitic impedances) and with the LNA's internal parasitic capacitance.

The wideband solutions according to various embodiments, such as shown in FIG. 1, realize the impedance presented to RX circuitry 40 in a wider band to cover as much bandwidth as possible with one impedance matching circuit. As a result, wideband impedance matching circuits according to various embodiments reduce or minimize the tuning sensitivity of conventional matching circuits, while still providing the desired impedance transformation.

TX matching circuit and balun 25 has a bandwidth that is less of a challenge, as it has inherently wider bandwidth due to the typically lower impedance transformation involved. In exemplary embodiments, TX matching circuit and balun 25 may be realized either by using discrete SMD elements (i.e., as a so-called discrete balun) or by using a coil/film type integrated balun together with some discrete elements, or by using a coil/film type integrated balun with proper leakage inductance at the TX side to resonate with the power amplifier capacitance.

At higher frequencies, distributed element baluns may be used as well, as persons of ordinary skill in the art will understand. Note that the particular realization of TX matching circuit and balun 25 does not affect the fundamental advantages of the HB-WB or LB-WB RX impedance matching circuits.

Without limitation, wideband impedance matching circuits according to various embodiments are advantageous for various RF circuits or apparatus, such as IPDs. Conventional IPD designs (868 MHz for HB and 434 MHz for LB) are based on tuned single band matching solutions, so that for each UHF band a new impedance matching circuit is designed. Impedance matching circuits according to various embodiments, however, provide both HB and LB operation, such as 868 MHz for HB operation and 434 MHz for LB operation, respectively.

Furthermore, impedance matching circuits according to various embodiments cooperate with IPDs without necessarily using film based ceramic baluns that may not fit well within the framework of IPD design. Impedance matching circuits according to various embodiments may be realized using discrete devices (e.g., SMD) and, thus, add flexibility to the design of IPDs. In addition, as the wideband design covers several bands, the overall number of IPD versions is reduced, thus decreasing manufacturing, testing, and logistical/infrastructure costs.

The above description provides some advantages and attributes of HB-WB RX impedance matching circuits according to various embodiments, such as the exemplary embodiment shown in FIG. 1. Similar considerations (impedance transformation, advantages, type/realization of TX matching circuit and balun 25 (if used, e.g., in a transceiver), etc.) apply to LB-WB RX impedance matching circuits.

Figure 2:
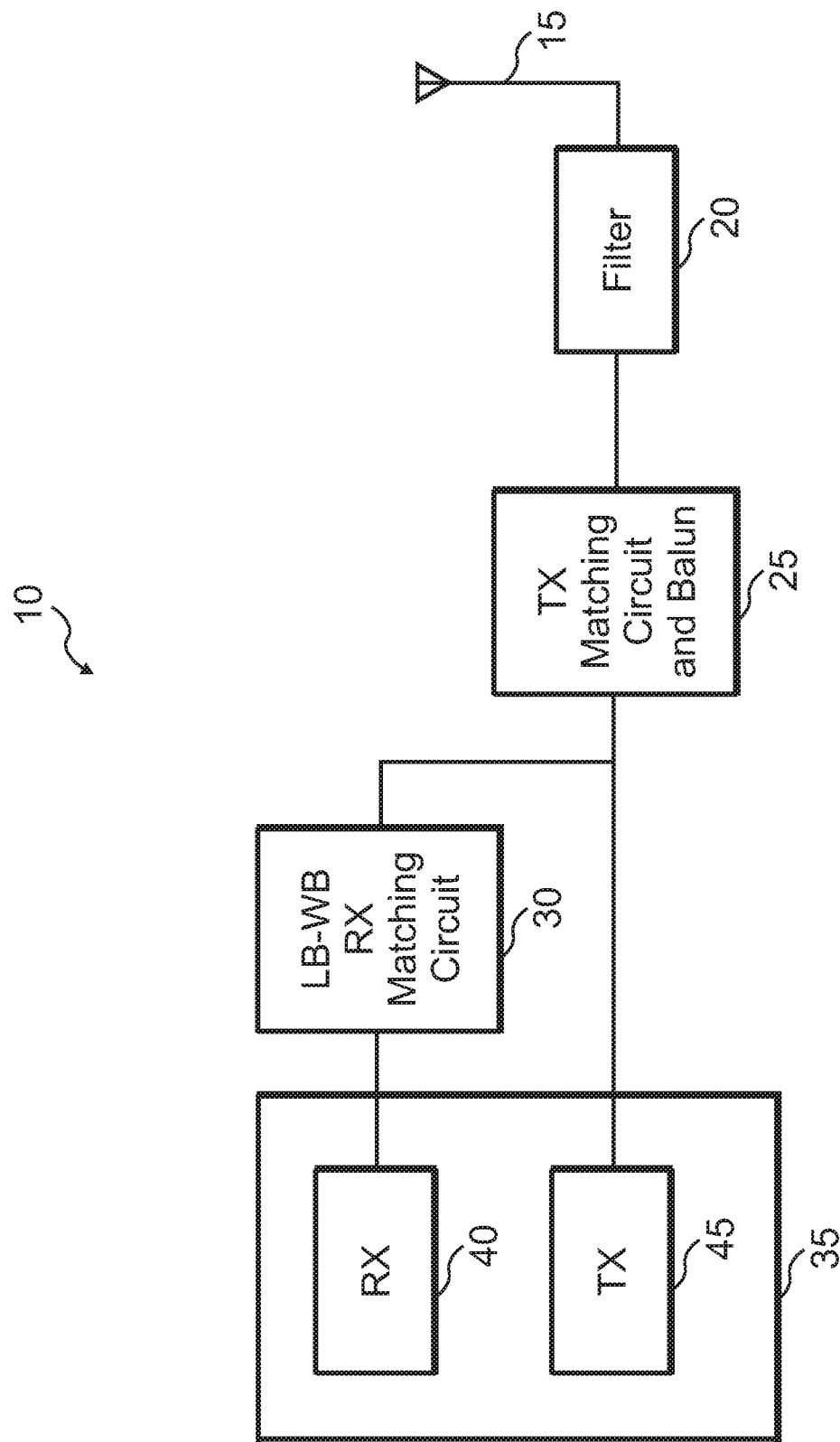
FIG. 2 shows a circuit arrangement for an RF apparatus with wideband impedance matching circuitry working in lower frequency bands (denoted by "LB-WB") according to an exemplary embodiment.

FIG. 2 shows a circuit arrangement 10 for an RF apparatus with LB-WB impedance matching circuitry according to an exemplary embodiment. The circuit in FIG. 2 is similar to, and operates similarly to, the circuit in FIG. 1.

Unlike the circuit in FIG. 1, however, the circuit in FIG. 2 uses an LB-WB RX impedance matching circuit 30. In other words, FIG. 2 shows an RF apparatus that provides wideband impedance matching, but in a lower band of operation (LB). Details of LB-WB RX impedance matching circuit 30 and its designs are described below in detail.

FIG. 1 and FIG. 2 show the use of impedance matching circuits according to various embodiments in RF transceivers. As noted above, however, impedance matching circuits according to various embodiments may also be used in RF receivers, as described below. As noted above, filter 20 is optional in various embodiments, such as the exemplary embodiment in FIG. 2, and may be omitted, depending on the circumstances, as detailed above.

Figure 3:
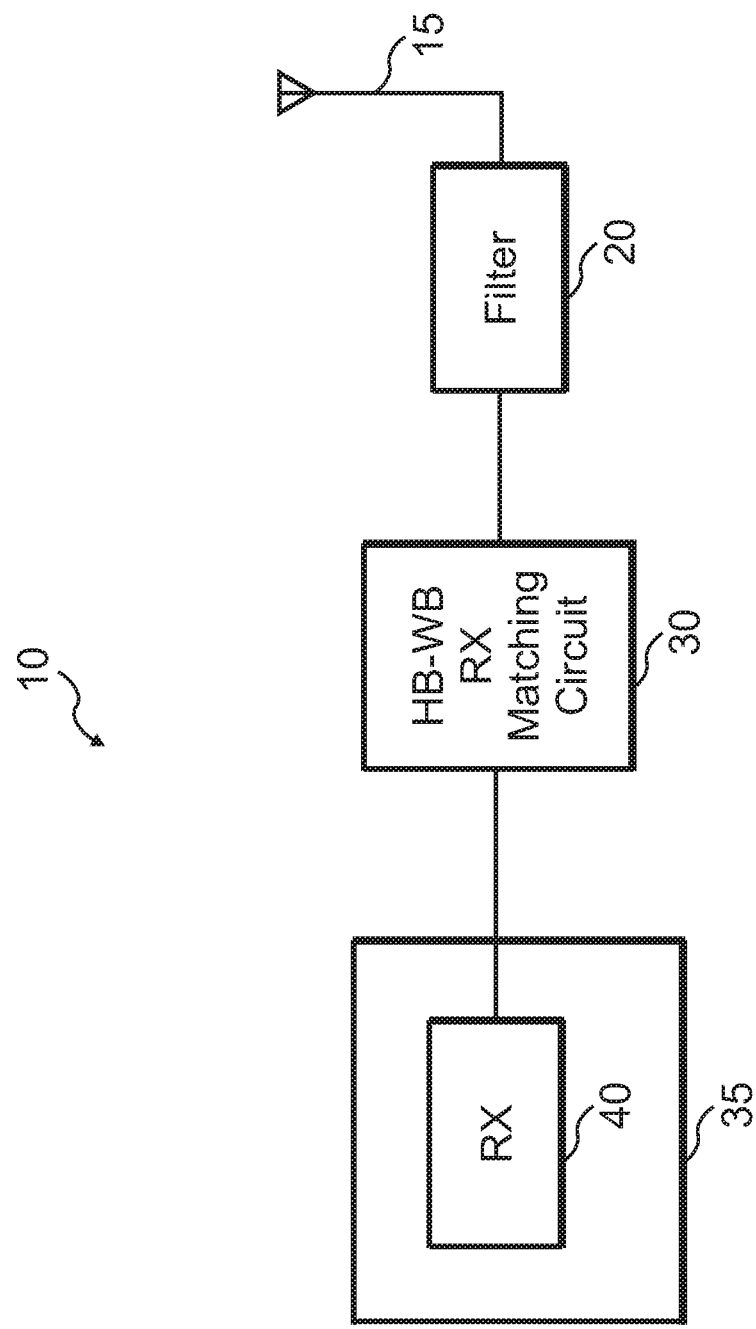
FIG. 3 shows a circuit arrangement for an RF apparatus with HB-WB impedance matching circuitry according to another exemplary embodiment.

FIG. 3 shows a circuit arrangement for an RF apparatus with HB-WB impedance matching circuitry according to another exemplary embodiment. More specifically, FIG. 3 shows an RF receiver that uses HB-WB RX impedance matching circuit 30.

Antenna 15 receives or transmits RF signals. Antenna 15 is coupled to filter 20. Filter 20 is coupled to HB-WB RX impedance matching circuit 30. HB-WB RX impedance matching circuit 30 is coupled to receiver or receive (RX) circuitry 40 in RF apparatus 35. Details of HB-WB RX impedance matching circuit 30 and its designs are described below in detail. As noted above, filter 20 is optional in various embodiments, such as the exemplary embodiment in FIG. 3, and may be omitted, depending on the circumstances, as detailed above.

The single ended signal from the 50-ohm antenna 15 is filtered by filter 20 and provided to HB-WB RX impedance matching circuit 30. HB-WB RX impedance matching circuit 30 up-converts the impedance to a 500-ohm impedance at the input of RX circuitry 40, typically the input of a low noise amplifier (LNA). HB-WB RX impedance matching circuit 30 resonates with the series parasitic inductances (e.g., bond-wire parasitic impedances) and with the LNA's internal parasitic capacitance, for example, ~1 pF.

Figure 4:
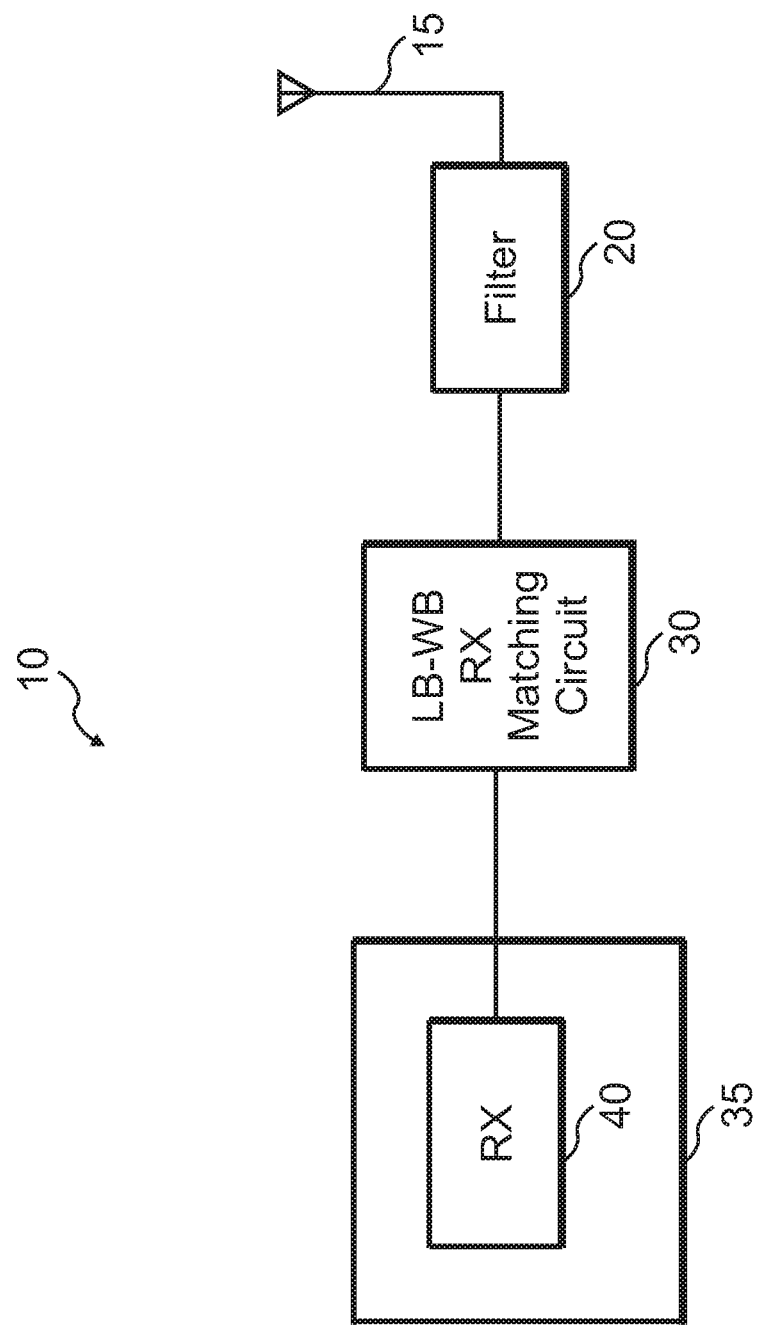
FIG. 4 shows a circuit arrangement for an RF apparatus with LB-WB impedance matching circuitry according to another exemplary embodiment.

FIG. 4 shows a circuit arrangement for an RF apparatus with LB-WB impedance matching circuitry according to another exemplary embodiment. The circuit in FIG. 4 is similar to, and operates similarly to, the circuit in FIG. 3.

Unlike the circuit in FIG. 3, however, the circuit in FIG. 4 uses an LB-WB RX impedance matching circuit 30. In other words, FIG. 4 shows an RF apparatus that provides wideband impedance matching, but in a lower band of operation (LB). Details of LB-WB RX impedance matching circuit 30 and its designs are described below in detail. As noted above, filter 20 is optional in various embodiments, such as the exemplary embodiment in FIG. 4, and may be omitted, depending on the circumstances, as detailed above.

Figure 5:
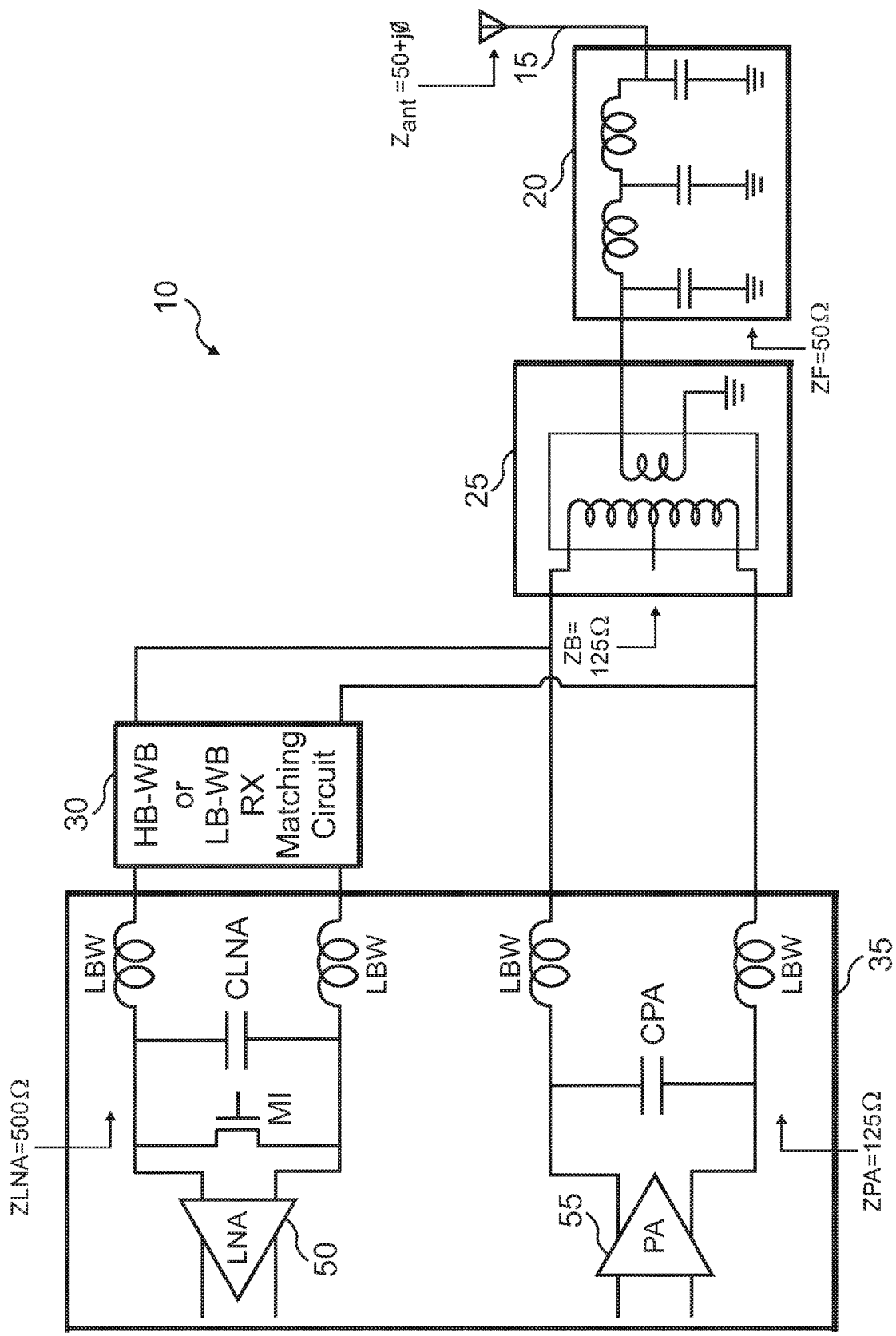
FIG. 5 shows a circuit arrangement for an RF apparatus with receive and transmit impedance matching circuitry according to an exemplary embodiment.

FIG. 5 shows a circuit arrangement for an RF apparatus with receive and transmit impedance matching circuitry according to an exemplary embodiment. More specifically, the circuit in FIG. 5 provides more details of the component arrangements and circuit topologies of filter 20, TX impedance matching circuit and balun 25, HB-WB RX impedance matching circuit 30 (or LB-WB RX impedance matching circuit 30 for operation in the LB), and RF apparatus 35.

Note that an LB version of the circuit may be realized by replacing HB-WB RX impedance matching circuit 30 with an LB-WB RX impedance matching circuit 30 (details of LB-WB RX impedance matching circuits and their design are described below, for example, in connection with FIGS. 6-8, 10, and 12). Note further that various blocks, such as filter 20 and TX impedance matching circuit and balun 25, may be realized or implemented using different components or technology, as desired.

For example, TX impedance matching circuit and balun 25 may be realized by using discrete SMD elements, a coil/film type integrated balun together with some discrete elements, or by using a coil/film type integrated balun with proper leakage inductance at the TX side to resonate with the power amplifier capacitance, as noted above. The choice of balun depends on various factors, as persons of ordinary skill in the art will understand. Such factors include design specifications, performance specifications, cost, module or device area, available technology, target markets, target end-users, etc.

Referring again to FIG. 5, antenna 15 has an impedance of 50Ω. Filter 20 is typically designed to present a 50-ohm impedance to antenna 15 to facilitate maximum power transfer. TX impedance matching circuit and balun 25 presents a 50-ohm impedance to filter 20.

In the RX mode, the single ended signal from the 50-ohm antenna 15 is filtered by filter 20 and provided to TX matching circuit and balun 25. TX matching circuit and balun 25 transforms the 50-ohm single-ended impedance to a 125-ohm differential impedance, i.e., the output impedance of TX circuitry 45 (commonly the power amplifier in TX circuitry 45).

As noted above, in this configuration, the TX matching circuit and balun 25 should be resonating with the internal parasitics of TX circuitry 45, e.g., the series parasitic inductances (bond-wire inductors LBW) and with the internal tunable capacitor CPA of power amplifier 55. In some embodiments, the internal tunable capacitor CPA of power amplifier 55 may have a capacitance of about 3.25 pF, which may be tuned to about 7 pF. The proposed WB impedance matching circuits, however, can operate with the default capacitance value (~3.5 pF) without additional tuning.

Similar to FIG. 1, HB-WB RX impedance matching circuit 30 is also coupled to the 125-ohm differential side of TX matching circuit and balun 25. HB-WB RX impedance matching circuit 30 up-converts the impedance to an impedance, such as a 500-ohm impedance in the embodiment shown, at the input of RX circuitry 40, at the input of LNA 50. HB-WB RX impedance matching circuit 30 resonates with the series parasitic inductances, i.e., the parasitic impedances of bond-wire parasitic inductors LBW, and with CLNA, i.e., the internal parasitic capacitance of LNA 50, which has a value of, for example, ~1 pF.

Note that, in the example above, the 500-ohm impedance represents a compromise. Typical LNA input impedances are much higher, on the order of 20 kn. Matching to such impedances, however, presents a challenge, given the state of art of surface mount devices (SMDs).

The wideband solutions according to various embodiments, such as shown in FIG. 5, realize the 500-ohm presented to RX circuitry 40 in a wider band to cover as much bandwidth as possible with one impedance matching circuit. As a result, wideband impedance matching circuits according to various embodiments reduce or minimize the tuning sensitivity of conventional matching circuits, while still providing the desired. impedance transformation.

During TX mode, PA 55 drives the antenna via TX impedance matching circuit and balun 25 and filter 20. During this mode, transistor M1 (e.g., a metal oxide semiconductor field effect transistor, or MOSFET, as shown in the example) effectively shorts the input of LNA 50. As a result, the TX signal, as coupled via HB-WB (or LB-WB) RX matching circuit 30 to the input of LNA 50, is prevented from over-driving the input of LNA 50.

As persons of ordinary skill in the art will understand, the circuitry for shorting the input of LNA 50, i.e., transistor M1, is merely an example, and other circuits (e.g., multiple transistors or switches) may be used to short the input of LNA 50, as desired. As merely one example, in some embodiments, a pair of MOSFETs may be used, one to selectively (i.e., during the TX mode) couple to ground each leg of the differential input of LNA 50.

TX matching circuit and balun 25 has a bandwidth that is less of a challenge, as it has inherently wider bandwidth due to the significantly lower impedance transformation involved (50Ω to 125Ω). In exemplary embodiments, TX matching circuit and balun 25 may be realized either by using discrete SMD elements (i.e., as a so-called discrete balun) or by using a coil/film type integrated balun together with some discrete elements, or by using a coil/film type integrated balun with proper leakage inductance at the TX side to resonate with the power amplifier capacitance.

At higher frequencies, distributed element baluns may be used as well, as persons of ordinary skill in the art will understand. Note that the particular realization of TX matching circuit and balun 25 does not affect the fundamental advantages of the HB-WB impedance matching circuits (or LB-WB impedance matching circuits.

Without limitation, wideband impedance matching circuits according to various embodiments are advantageous for various RF circuits or apparatus, such as IPDs. Conventional IPD designs (868 MHz for HB and 434 MHz for LB) are based on tuned single band matching solutions, so that for each UHF band a new impedance matching circuit is designed. Impedance matching circuits according to various embodiments, however, provide both HB and LB operation, such as 868 MHz for HB operation and 434 MHz for LB operation, respectively.

Furthermore, impedance matching circuits according to various embodiments cooperate with IPDs without necessarily using film based ceramic baluns that may not fit well within the framework of IPD design. Impedance matching circuits according to various embodiments may be realized using discrete devices (e.g., SMD) and, thus, add flexibility to the design of IPDs. In addition, as the wideband design covers several bands, the overall number of IPD versions is reduced, thus decreasing manufacturing, testing, and logistical/infrastructure costs.

The above description provides some advantages and attributes of HB-WB RX impedance matching circuits according to various embodiments, such as the exemplary embodiment shown in FIGS. 1, 3, and 5. Similar considerations (impedance transformation, advantages, type/realization of TX matching circuit and balun 25 (if used, e.g., in a transceiver), etc.) apply to LB-WB RX impedance matching circuits, such as shown in FIGS. 2 and 4.

With respect to designing HB-WB and LB-WB RX impedance matching circuits, with fixed impedance at the input of RX circuitry (500 ohms) and with fixed RX input capacitance (e.g., 1 pF) the bandwidth depends on the frequency and on the level of mismatch. In some embodiments, the aim is to have a reflection coefficient (S11) of better than −10 dB in the targeted operation bandwidth on both ports of the impedance matching circuit. Other passband S11 (i.e., mismatch) specifications vary the achievable bandwidth for a given frequency band, but the principles of operation of the impedance matching circuit does not change.

In theory, with these conditions a maximum bandwidth of ~450 MHz can be achieved around a center frequency of 890 MHz. With real, practical SMD elements, good matching is achieved in the 780 MHz to 950 MHz frequency range. In exemplary embodiments, the 780 MHz to 950 MHz may be the HB frequency range. At lower bands, relatively good impedance matching (S11 of −10 dB or better) in the 310 MHz to 510 MHz frequency range. In exemplary embodiments, the 310 MHz to 510 MHz may be the LB frequency range.

Impedance matching circuits according to various embodiments address the issue of replacing the high voltage gain, high-Q response of a theoretical wide-band matching circuit with circuitry that achieves similar voltage gain. As noted above, in exemplary embodiments, a 125-ohm differential impedance is matched to a 500-ohm differential impedance in parallel with 1 pF of LNA capacitance while maintaining a high bandwidth.

To simplify the design of impedance matching circuits, in exemplary embodiments, half of the differential RX impedance matching circuit that matches a single-ended 62-ohm generator and a single-ended 250-ohm load in parallel with a 2 pF capacitor. Once half of the impedance matching circuit is designed, unifying two single-ended half circuits provides a complete differential impedance matching circuit. As noted above, filter 20 is optional in various embodiments, such as the exemplary embodiment in FIG. 5, and may be omitted, depending on the circumstances, as detailed above.

Figure 6:
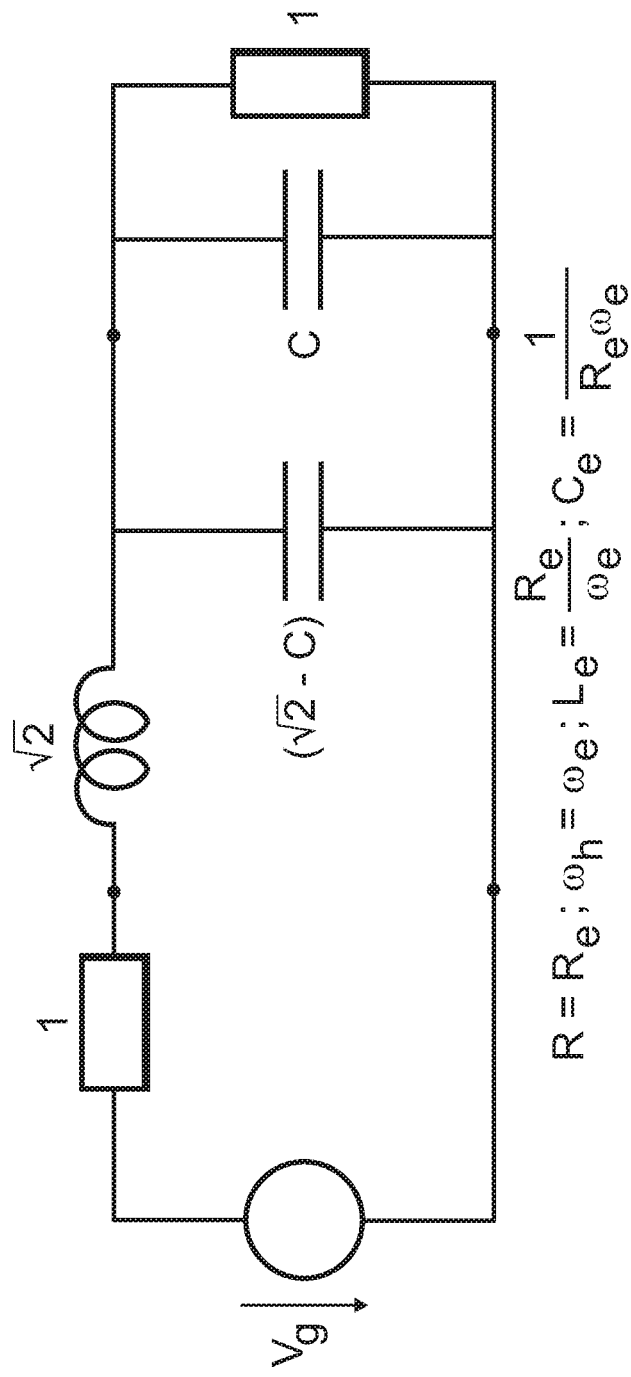
FIG. 6 shows a circuit arrangement for calculating impedance matching circuitry component values.

Design of impedance matching circuits according to various embodiments starts with using the matching network given in D. C. Youla, A New Theory of Broadband Matching, IEEE Transactions on Circuits and Systems, CT11: 30-50 (1964). FIG. 6 shows Youla's circuit arrangement for calculating impedance matching circuitry component values.

More specifically, FIG. 6 shows a second-order single-ended matching circuit if the generator and termination impedances have the same real part (but possibly different complex parts). The matching circuit provides maximally flat low-pass S11 responses up to the desired −3 dB cut-off frequency of the band of interest.

The design of the matching circuit includes determination of the relative frequency ($\omega_e$) unit, which is equal to the targeted cut-off frequency, and the determination of the relative resistance ($R_e$) unit, as shown in FIG. 6. Once the relative frequency ($\omega_e$) unit and the relative resistance ($R_e$) unit are known, the relative capacitance and inductance units (denoted by $C_e$ and $L_e$, respectively) are derived, as shown in FIG. 6. Note that the component or element values in FIG. 6 are in relative units, i.e., relatively to $\omega_e$ and $R_e$.

If the load capacitance (C) value (in $C_e$ relative units) exceeds the square-root of 2 ($\sqrt{2}$), then the parallel capacitance of the matching circuit (the capacitor with the value of $\sqrt{2}$–C) will have a negative capacitance value. In impedance matching circuits according to various embodiments, the parallel capacitance is replaced with a parallel inductance. Although doing so tends to restrict bandwidth somewhat (because the inductor's frequency characteristics are different from a capacitor's), it is nevertheless a relatively good compromise as it provides relatively high bandwidth (WB), with realizable (e.g., non-negative) component values and at relatively low cost.

The matching circuit is calculated for half of the differential HB-WB RX impedance matching circuit (or LB-WB RX impedance matching circuit) to provide matching between single-ended terminations with equal impedance real parts, e.g., between a 250-ohm generator and a 250-ohm in parallel with 2 pF of capacitance load.

Figure 7:
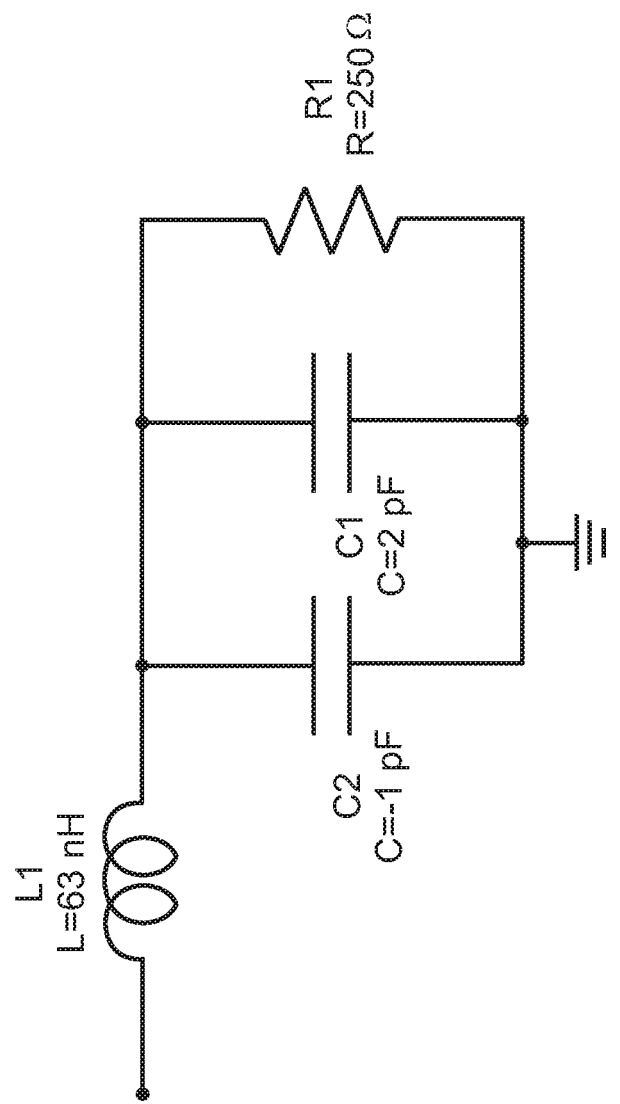
FIG. 7 shows a circuit arrangement for an impedance matching circuitry.

FIG. 7 shows a circuit arrangement for such an impedance matching circuitry. The targeted −3 dB cutoff for S11 is 899 MHz in this example. Note that the parallel matching capacitor (C2) has a negative capacitance, i.e., −1 pF.

Figure 8:
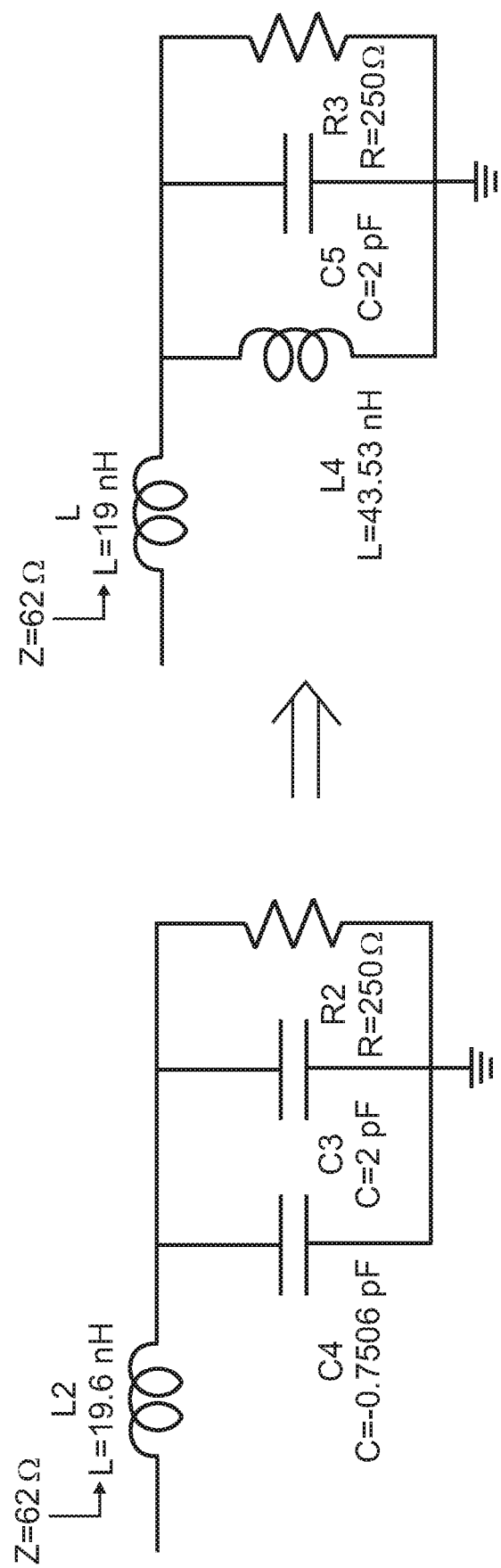
FIG. 8 shows a circuit arrangement for transforming an impedance matching circuitry according to an exemplary embodiment.

Next, the impedance matching circuit is optimized to provide impedance matching between non-equal termination impedances, such as between 62 ohms and 250 ohms in this example. Optimization may be performed in a variety of ways, as desired. Examples include circuit optimization techniques like gradient, simulated annealing, genetic optimization techniques, and the like, as persons of ordinary skill in the art will understand. FIG. 8 shows the resulting impedance matching circuits. In the circuit on the left side of FIG. 8, the parallel capacitor (C4) has a negative capacitance. In the circuit on the right side of FIG. 8, capacitor C4 has been replaced with inductor L4, as described above, with an inductance of 43.53 nH.

As a result, the circuit may be realized using physical, real-life components, such as SMD components. The impedance matching circuit on the right side of FIG. 8 has ~240 MHz bandwidth (992 MHz to 752 MHz), corresponding to the HB-WB impedance matching operation.

Figure 9:
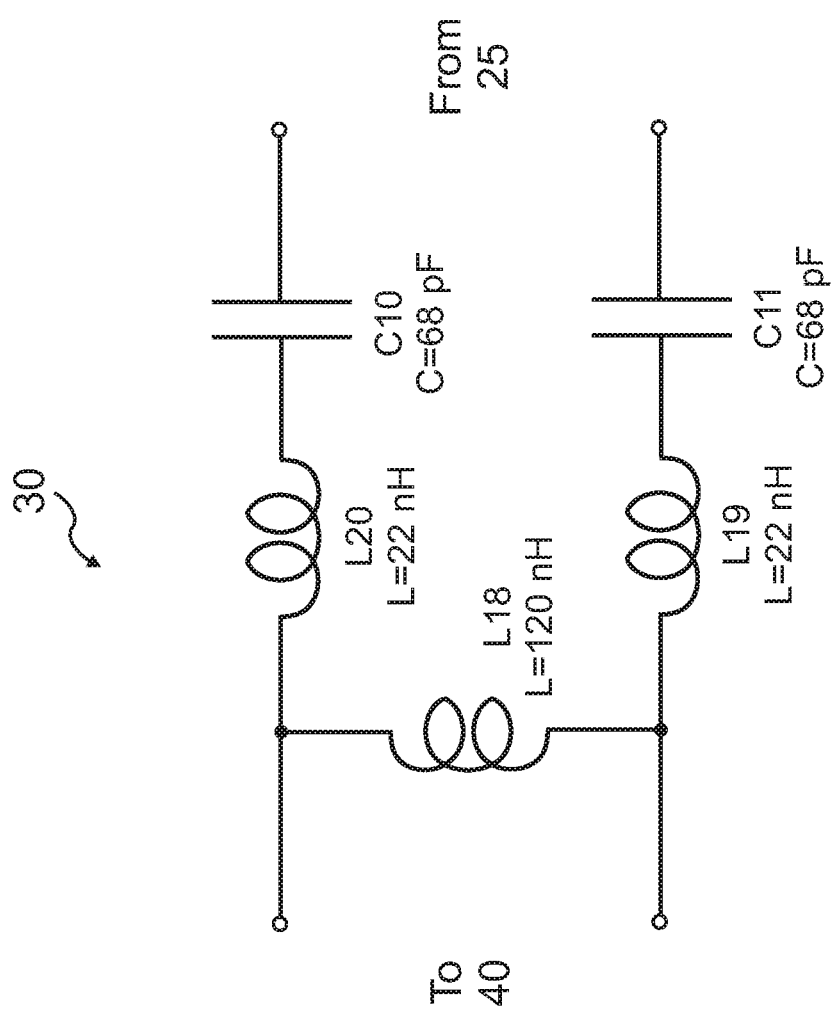
FIG. 9 shows a circuit arrangement for an HB-WB matching circuit according to an exemplary embodiment.

FIG. 9 shows a circuit arrangement for an HB-WB RX impedance matching circuit 30 according to an exemplary embodiment. More specifically, FIG. 9 shows a differential HB-WB RX impedance matching circuit 30 that provides impedance matching between a 125-ohm generator and a parallel resistor-capacitor (RC), e.g., 500 ohms and 1 pF.

HB-WB RX impedance matching circuit 30 is created from two single-ended circuits, as described above. FIG. 9 shows the final schematic of HB-WB RX impedance matching circuit 30, i.e., after designing a half circuit and optimizing, as described above), for HB-WB operation in the 780 MHz to 950 MHz frequency band.

Note that capacitors C10 and C11 capacitors are DC bypass capacitors. They prevent DC currents from flowing into the input of the RX LNA (e.g., LNA 50 in FIG. 5). If the RX circuitry includes internal DC blocking, capacitors C10 and C11 may be omitted from HB-WB RX impedance matching circuit 30.

The same procedure as described above with respect to HB-WB RX impedance matching circuits may be used to design and realize impedance matching circuits for other frequencies, for example, LB-WB RX impedance matching circuits. At lower frequencies, the capacitance unit ($C_e$) is higher and, thus, the parallel capacitor in the impedance matching circuit might have a positive value.

Figure 10:
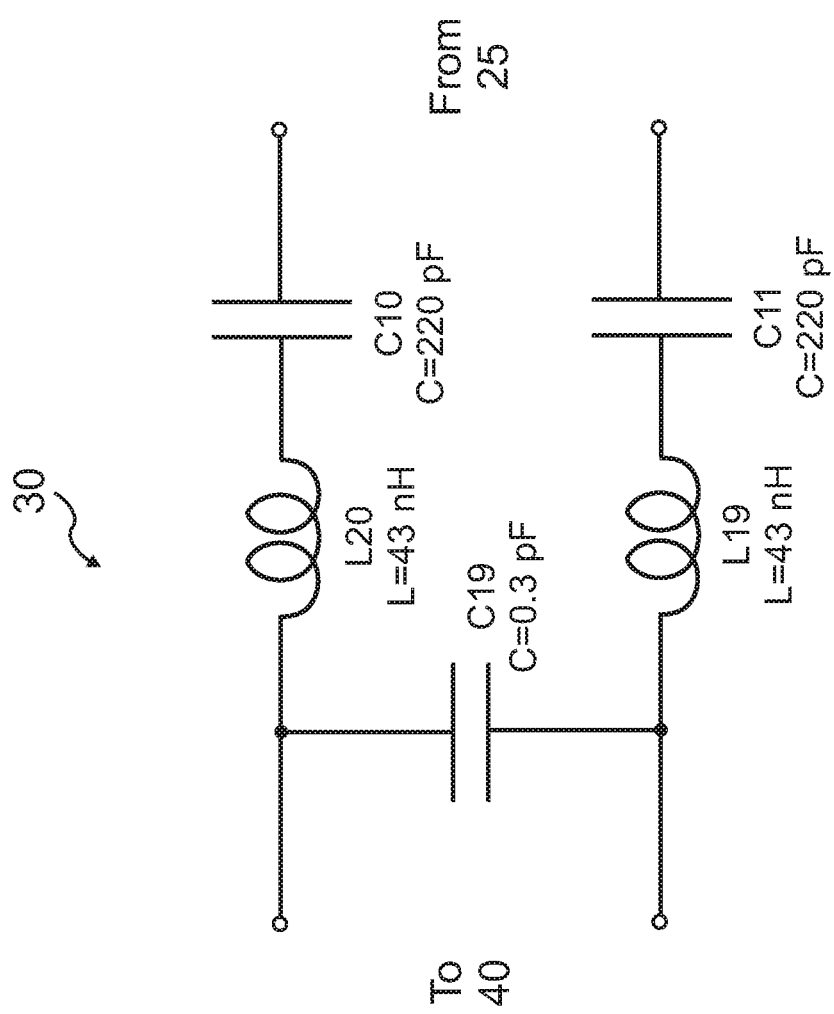
FIG. 10 shows a circuit arrangement for an LB-WB matching circuit according to an exemplary embodiment.

FIG. 10 shows a final circuit arrangement for an LB-WB impedance matching circuit 30 according to an exemplary embodiment. In the example shown, LB-WB RX impedance matching circuit 30 provides differential impedance matching between the same terminations as assumed above for HB-WB impedance matching, i.e., between a 125-ohm generator and a 500-ohm and 1 pF parallel RC load. LB-WB RX impedance matching circuit 30 provides impedance matching in the LB frequency band, 310 MHz to 510 MHz for the example shown.

Note that capacitors C10 and C11 capacitors are DC bypass capacitors. They prevent DC currents from flowing into the input of the RX LNA (e.g., LNA 50 in FIG. 5). If the RX circuitry includes internal DC blocking, capacitors C10 and C11 may be omitted from LB-WB RX impedance matching circuit 30.

As noted above, the impedance matching circuits according to various embodiments typically operate in conjunction with a filter, such as filter 20 (see, for example, FIG. 1). The filter design is well known to persons of ordinary skill in the art. The number of filter sections or stages depends on the harmonic emission of the applied RF IC and on the standards limits for the targeted bandwidth.

In exemplary embodiments, for both the HB-WB and the LB-WB impedance matching circuits, a 5th order Chebyshev filter may be used. As persons of ordinary skill in the art will understand, however, other types or configurations of filters may be used, as desired.

Figure 11:
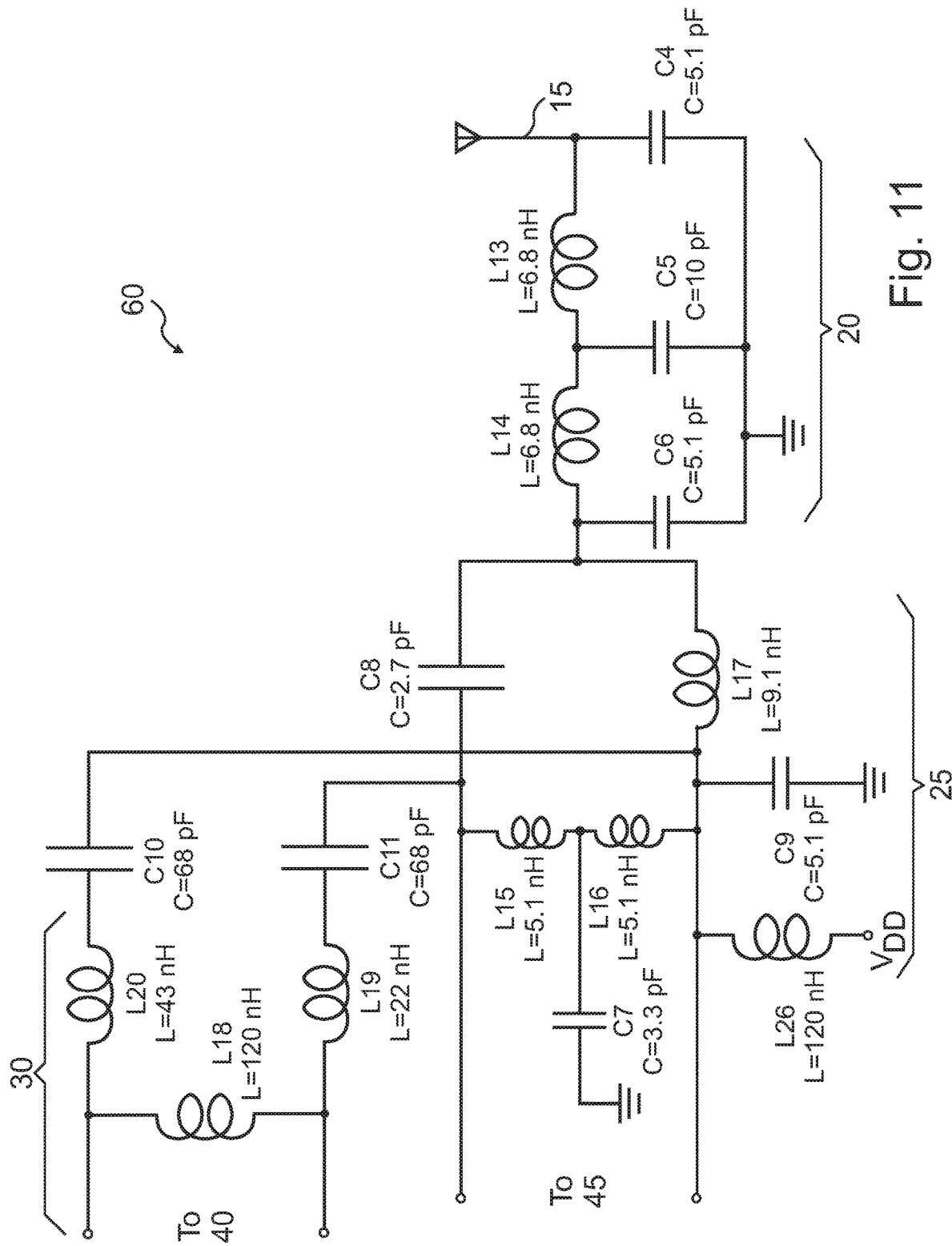
FIG. 11 shows a circuit arrangement for an HB-WB receive matching circuit and a transmit matching circuit according to an exemplary embodiment.

As noted above, TX impedance matching circuit and balun 25 may be realized as using discrete components or may comprise a coil/film-type balun. FIG. 11 shows a circuit arrangement 60 for an HB-WB receive matching circuit and a transmit matching circuit according to an exemplary embodiment. In circuit arrangement 60, HB-WB RX impedance matching circuit 30 is optimized for operation in the 780 MHz to 950 MHz frequency band (the same impedance matching circuit shown in FIG. 9).

Furthermore, TX impedance matching circuit and balun 25 is realized using discrete components. Note that, in this example, TX impedance matching circuit and balun 25 includes an additional 2nd harmonic trap formed by inductors L15 and L16, and capacitor C7.

As noted above, capacitors C10 and C11 are RX bypass capacitors, and inductor L26, coupled to supply voltage ($V_{DD}$) acts as DC feed and choke inductor. These elements may be omitted if the RX circuitry is DC blocked internally and/or the power amplifier is DC fed internally.

In the TX mode of operation, the RX protection circuitry (e.g., transistor M1 in FIG. 5) conducts, and shorts the RX impedance match parallel inductor (L18). As a result, the series RX inductors L19 and L20 are coupled in parallel with the TX balun inductors L15 and L16. As the RX inductors typically have higher values than the TX balun inductors, their effect on operation in the TX mode is relatively small, and may be eliminated with slight tuning of values of the TX balun inductors L15 and L16. As noted above, filter 20 is optional in various embodiments, such as the exemplary embodiment in FIG. 11, and may be omitted, depending on the circumstances, as detailed above.

Figure 12:
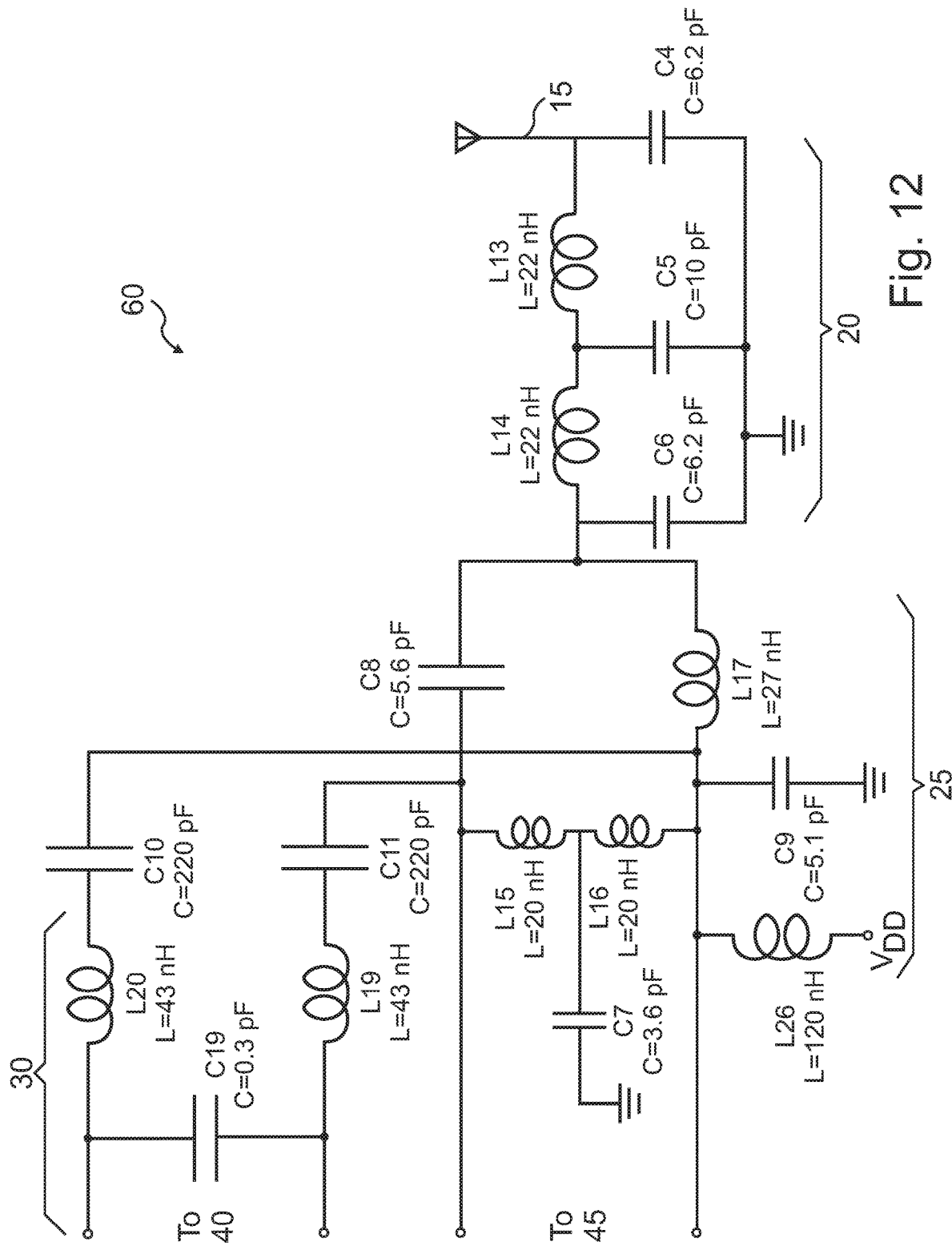
FIG. 12 shows a circuit arrangement for an LB-WB receive matching circuit and a transmit matching circuit according to an exemplary embodiment.

FIG. 12 shows a circuit arrangement for an LB-WB receive impedance matching circuit and a transmit impedance matching circuit according to an exemplary embodiment. In this example, the RX impedance matching circuit of FIG. 10 is used. Thus, LB-WB RX impedance matching circuit 30 provides impedance matching in the LB frequency band, 310 MHz to 510 MHz for the example shown. As noted above, filter 20 is optional in various embodiments, such as the exemplary embodiment in FIG. 12, and may be omitted, depending on the circumstances, as detailed above.

Figure 13:
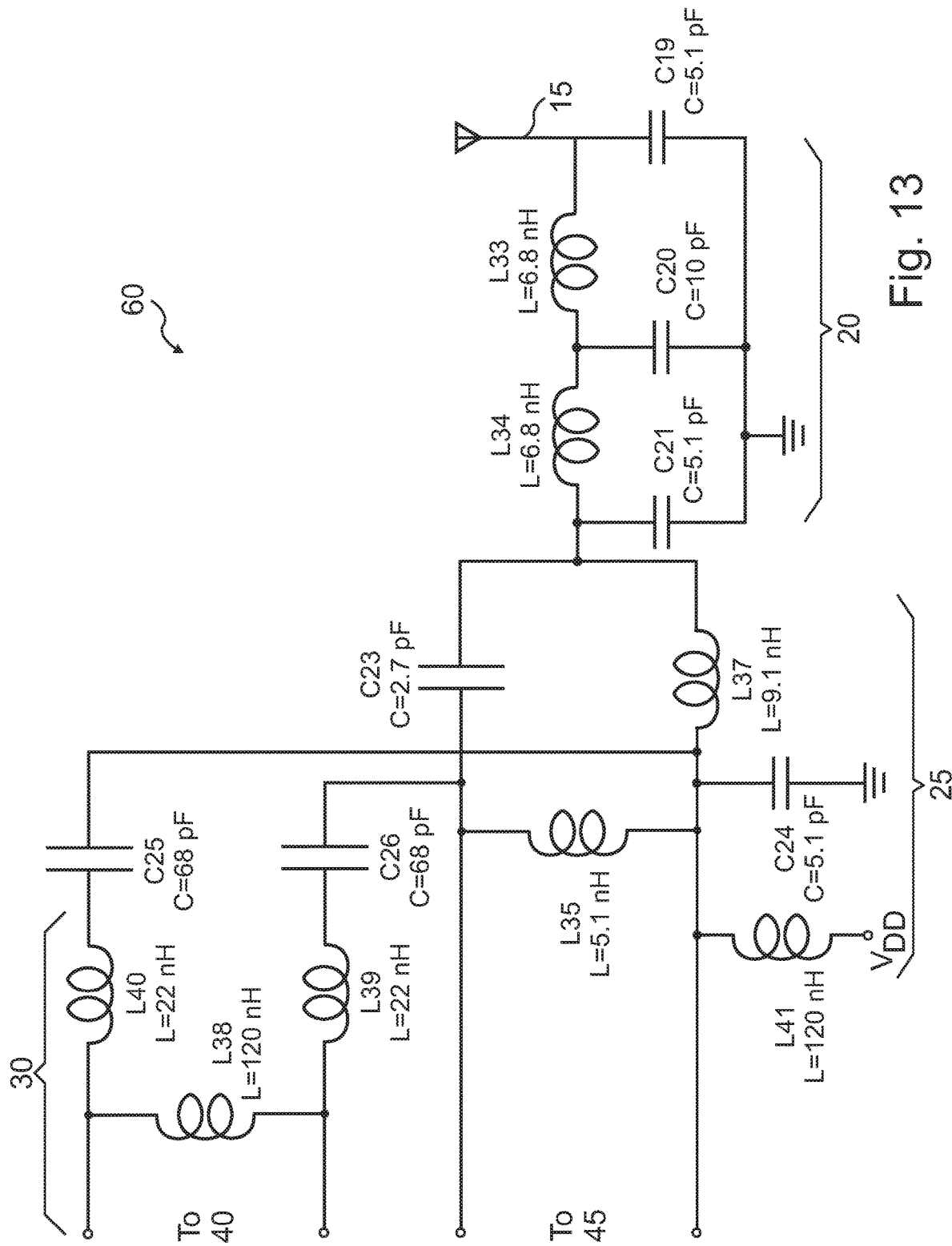
FIG. 13 shows a circuit arrangement for an HB-WB receive matching circuit and a transmit matching circuit with a simplified balun according to an exemplary embodiment.

FIG. 13 shows a circuit arrangement for an HB-WB receive matching circuit and a transmit matching circuit with a simplified balun according to an exemplary embodiment. More specifically, TX impedance matching circuit and balun 25 uses a different type of TX balun that does not have a 2nd harmonic trap. The type of the TX balun used does not change the fundamentals of the impedance matching circuitry, as FIG. 13 uses the HB-WB RX impedance matching circuit shown in FIGS. 9 and 11. As noted above, filter 20 is optional in various embodiments, such as the exemplary embodiment in FIG. 13, and may be omitted, depending on the circumstances, as detailed above.

Figure 14:
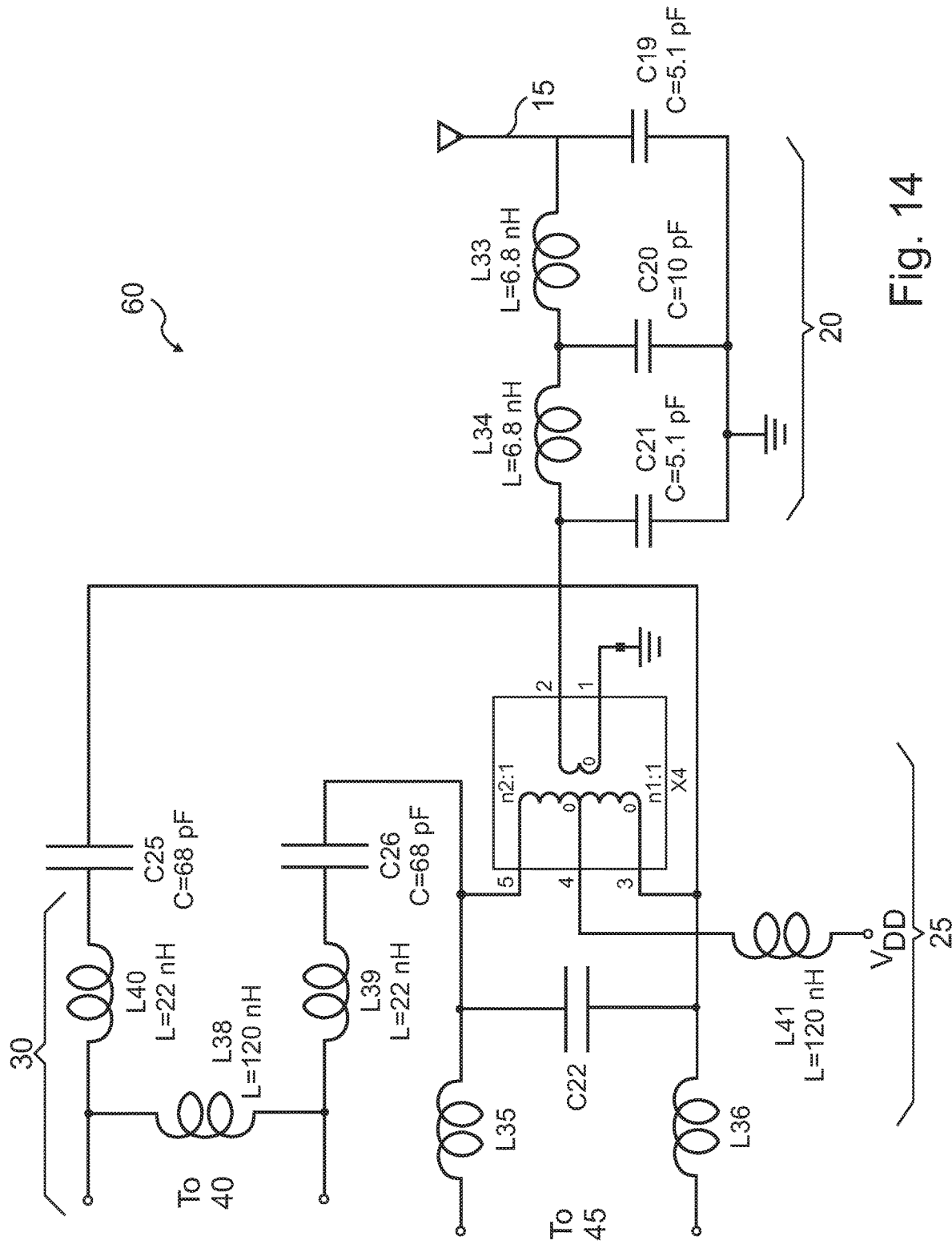
FIG. 14 shows a circuit arrangement for an HB-WB receive matching circuit and a transmit matching circuit with a coil/film balun according to an exemplary embodiment.

FIG. 14 shows a circuit arrangement for an HB-WB receive matching circuit and a transmit matching circuit with a coil/film balun according to an exemplary embodiment. In this embodiment, the power amplifier is fed DC power via inductor L41 and the balun's center tap (denoted as node "4"). If a balun without a center tap is used, however, the DC feed method shown, for example, in FIG. 13, may be used.

Referring again to FIG. 14, note that the balun (labeled "X4") has a 1:1 transfer ratio, although other values may be used, as desired. Because of the 1:1 transfer ratio, impedance transformation from 50Ω to 125Ω (for the power amplifier) is done by additional discrete components, i.e., L35, L36, and C22). If, however, a balun with an appropriate transfer ratio is used, the additional discrete components may be omitted (without changing the fundamental principles of operation of the RX impedance matching circuit). As noted above, filter 20 is optional in various embodiments, such as the exemplary embodiment in FIG. 14, and may be omitted, depending on the circumstances, as detailed above.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired.

Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. A radio-frequency (RF) apparatus, comprising:
a wideband receive (RX) impedance matching circuit to provide a received differential RF signal to RF receive circuitry, the wideband RX impedance matching circuit having a relative bandwidth of 10% to 20%, wherein the wideband RX impedance matching circuit is derived from first and second single-ended matching circuits, the wideband RX impedance matching circuit comprising first and second inductors to receive the differential RF signal, and a third inductor coupled across an input of the RF receive circuitry to substitute for a capacitor having a negative capacitance value.

2. The RF apparatus according to claim 1, wherein the wideband RX impedance matching circuit comprises a high band (HB) impedance matching circuit.

3. The RF apparatus according to claim 2, wherein the high band (HB) impedance matching circuit operates in a band of frequencies from 780 MHz to 950 MHz.

4. The RF apparatus according to claim 1, wherein the wideband RX impedance matching circuit comprises a low band (LB) impedance matching circuit.

5. The RF apparatus according to claim 4, wherein the low band (LB) impedance matching circuit operates in a band of frequencies from 310 MHz to 510 MHz.

6. The RF apparatus according to claim 1, further comprising a transmit (TX) impedance matching circuit and balun coupled to the wideband RX impedance matching circuit and to RF TX circuitry.

7. The RF apparatus according to claim 2, wherein the wideband RX impedance matching circuit matches an impedance of the TX impedance matching circuit and balun to an impedance of the RF receive circuitry.

8. The RF apparatus according to claim 2, further comprising a filter coupled to the TX impedance matching circuit and balun, and an antenna coupled to the filter.

9. The RF apparatus according to claim 3, wherein the wideband RX impedance matching circuit, the TX impedance matching circuit and balun, and the filter are included in an integrated passive device (IPD).

10. A method of operating a radio-frequency (RF) apparatus comprising RF receive circuitry, the method comprising using a wideband receive (RX) impedance matching circuit, wherein the wideband RX impedance matching circuit has a relative bandwidth of 10% to 20% and is derived from first and second single-ended matching circuits, the wideband RX impedance matching circuit comprising first and second inductors to match an impedance of a circuit providing a received RF signal to an impedance of the RF receive circuitry, and to provide a differential RF signal to the RF receive circuitry, by using a third inductor coupled across an input o the RF receive circuitry, the third inductor to substitute for capacitor having a negative capacitance value.

11. The method according to claim 10, further comprising using a TX impedance matching circuit and balun coupled to the wideband RX impedance matching circuit.

12. The method according to claim 11, further comprising using a filter coupled to the TX impedance matching circuit and balun, and using an antenna coupled to the filter.

13. The method according to claim 12, wherein the wideband RX impedance matching circuit, the TX impedance matching circuit and balun, and the filter are included in an integrated passive device (IPD).

14. The method according to claim 10, wherein the wideband RX impedance matching circuit comprises a high band (HB) impedance matching circuit.

15. The method according to claim 14, wherein the high band (HB) impedance matching circuit operates in a band of frequencies from 780 MHz to 950 MHz.

16. The method according to claim 10, wherein the wideband RX impedance matching circuit comprises a low band (LB) impedance matching circuit.

17. The method according to claim 16, wherein the low band (LB) impedance matching circuit operates in a band of frequencies from 310 MHz to 510 MHz.

18. The method according to claim 10, further comprising operating the RF apparatus in a receive mode or in a transmit mode.

19. The method according to claim 18, wherein operating the RF apparatus in the transmit mode comprises shorting the input of the RF receive circuitry.

20. The method according to claim 10, wherein the wideband RX impedance matching circuit and a filter are included in an integrated passive device (IPD).

* * * * *